United States Patent
Egger et al.

(10) Patent No.: US 11,659,699 B2
(45) Date of Patent: May 23, 2023

(54) POWER ELECTRONICS UNIT

(71) Applicant: Mahle International GmbH, Stuttgart (DE)

(72) Inventors: Sebastian Egger, Ehningen (DE); Matthias Ganz, Stuttgart (DE); Janko Horvat, Leibnitz (DE); Niklas Kull, Stuttgart (DE); Peter Sever, Murska Sobota (SI)

(73) Assignee: Mahle International GmbH

( * ) Notice: Subject to any disclaimer, the term of this patent is extended or adjusted under 35 U.S.C. 154(b) by 97 days.

(21) Appl. No.: 17/259,156

(22) PCT Filed: May 24, 2019

(86) PCT No.: PCT/EP2019/063487
§ 371 (c)(1),
(2) Date: Jan. 8, 2021

(87) PCT Pub. No.: WO2020/011438
PCT Pub. Date: Jan. 16, 2020

(65) Prior Publication Data
US 2021/0159148 A1    May 27, 2021

(30) Foreign Application Priority Data
Jul. 11, 2018   (DE) .............. 10 2018 211 520.6

(51) Int. Cl.
*H01L 23/473*     (2006.01)
*H01L 23/373*     (2006.01)
(Continued)

(52) U.S. Cl.
CPC ........ *H05K 7/20927* (2013.01); *F28F 13/02* (2013.01); *H01L 23/3735* (2013.01);
(Continued)

(58) Field of Classification Search
CPC ................ H01L 23/31; H01L 23/34; H01L 23/36–3677; H01L 23/3733;
(Continued)

(56) References Cited

U.S. PATENT DOCUMENTS

| 5,083,194 A * | 1/1992 | Bartilson ............ H01L 23/3677 257/722 |
| 5,316,075 A * | 5/1994 | Quon ................... F28F 13/02 257/E23.098 |

(Continued)

FOREIGN PATENT DOCUMENTS

| DE | 102008035252 A1 | 2/2009 |
| DE | 102010043904 A1 | 6/2011 |

(Continued)

OTHER PUBLICATIONS

English abstract for DE-102008035252.
Japan Office Action dated Dec. 20, 2022 for copending Japan Patent App. No. JP2020-573312 (with English translation).

*Primary Examiner* — Zachary Pape
*Assistant Examiner* — Amir A Jalali
(74) *Attorney, Agent, or Firm* — Fishman Stewart PLLC

(57) ABSTRACT

A power electronics unit may include a circuit board and a cooling device. The circuit board may include at least one electronic component which, in a heat transfer region, is disposed flat against an electronics side of the circuit board. The cooling device may include at least one impingement jet chamber through which a cooling fluid is flowable from an inlet to an outlet. The cooling device may further include at least one nozzle plate having at least one flow nozzle. The at least one nozzle plate may be arranged in and divide the at least one impingement jet chamber into an inlet chamber and an outlet chamber, which may be fluidically connected to one another via the at least one flow nozzle. The at least one flow nozzle may accelerate and conduct the cooling (Continued)

fluid towards the heat transfer region of the at least one electronic component.

19 Claims, 3 Drawing Sheets

(51) Int. Cl.
  *F28F 13/02*  (2006.01)
  *H05K 7/20*  (2006.01)
  *H05K 1/02*  (2006.01)

(52) U.S. Cl.
  CPC ..... *H01L 23/4735* (2013.01); *H05K 7/20327* (2013.01); *H05K 7/20345* (2013.01); *H05K 1/0203* (2013.01)

(58) Field of Classification Search
  CPC ... H01L 23/3735; H01L 23/427; H01L 23/46; H01L 23/473; H01L 23/4735; H01L 23/50; H05K 7/2087; H05K 7/20927; H05K 7/20218; H05K 7/20254; H05K 7/2029; H05K 7/20236; H05K 7/20309–20327; H05K 7/20345; H05K 7/20663; H05K 7/20681; H05K 7/20709; H05K 7/20772; H05K 7/20818; H05K 7/20872; H05K 7/20881; H05K 7/20936; H05K 1/0201–0212; H05K 1/0272; H05K 1/181–188; H05K 2201/064; H05K 2201/10166; H01H 9/52
  See application file for complete search history.

(56) References Cited

U.S. PATENT DOCUMENTS

| | | | |
|---|---|---|---|
| 5,453,911 A * | 9/1995 | Wolgemuth | H05K 7/20927 361/689 |
| 5,959,351 A | 9/1999 | Sasaki et al. | |
| 6,410,978 B1 * | 6/2002 | Yasukawa | H05K 1/0271 257/713 |
| 8,169,779 B2 * | 5/2012 | Le | H01L 23/4735 361/689 |
| 2002/0162673 A1 * | 11/2002 | Cook | H05K 9/009 174/391 |
| 2005/0143000 A1 * | 6/2005 | Eisele | H05K 7/20927 257/E23.098 |
| 2007/0183125 A1 * | 8/2007 | Tilton | H01L 23/4735 361/699 |
| 2009/0032937 A1 * | 2/2009 | Mann | H01L 23/4735 165/80.4 |
| 2010/0033932 A1 * | 2/2010 | Thome | H05K 7/20927 361/699 |
| 2010/0091457 A1 | 4/2010 | Krause | |
| 2011/0141690 A1 * | 6/2011 | Le | H01L 23/4735 361/689 |
| 2012/0048515 A1 * | 3/2012 | Bhunia | H01L 23/4735 165/104.21 |
| 2012/0063091 A1 * | 3/2012 | Dede | H05K 7/20927 174/15.1 |
| 2013/0314870 A1 | 11/2013 | Kwak et al. | |
| 2015/0043164 A1 * | 2/2015 | Joshi | G06F 1/20 165/185 |
| 2017/0055378 A1 | 2/2017 | Zhou et al. | |
| 2018/0142968 A1 * | 5/2018 | Deguchi | F28F 13/12 |

FOREIGN PATENT DOCUMENTS

| | | |
|---|---|---|
| JP | H06-104358 A | 4/1994 |
| JP | 2000514252 A | 10/2000 |
| JP | 2006310363 A | 11/2006 |
| JP | 2013247354 A | 12/2013 |
| WO | WO-98/44307 A1 | 10/1998 |

* cited by examiner

POWER ELECTRONICS UNIT

CROSS-REFERENCE TO RELATED APPLICATIONS

This application claims priority to International Patent Application No. PCT/EP2019/063487, filed on May 24, 2019, and German Patent Application No. DE 10 2018 211 520.6, filed on Jul. 11, 2018, the contents of both of which are hereby incorporated by reference in their entirety.

TECHNICAL FIELD

The invention relates to a power electronics unit having at least one circuit board and having a cooling device.

BACKGROUND

Generic power electronics units are already known from the prior art. These comprise a circuit board—for example a DBC board (DBC: Direct Bonded Copper)—on which electrical components—such as for example bipolar transistors with insulated gate electrode (IGBT), metal oxide semiconductor field effect transistors (MOSFETs) or diodes—are arranged and interconnected. During the operation of the power electronics unit, a power dissipation is generated in the electrical components which leads to the heating of the electrical components in the power electronics unit. Here, the current working temperature of the electrical components depends on an electric current flow in these and must meet the maximum permissible operating temperature. Here, the operating temperature depends on the operating point—current, voltage, frequency, phase angle, degree of modulation—and cooling. The maximum permissible operating temperature and the number of the temperature changes thus constitute a limiting factor during the operation of the power electronics unit.

In order to discharge the power dissipation and thereby protect the electrical components from damage and from failure, the same have to be cooled. This can take place directly or indirectly. In the case of an indirect cooling, the electrical component is connected, via a thermal connecting layer—a so-called thermal interface material (TIM)—to a heat sink—for example a cooling plate through which a cooling fluid can flow. Since the connecting layer makes a substantial contribution to the thermal resistance, the power electronics unit—with high heat flow densities, should be cooled directly without the connecting layer. In the process, the circuit board forms a wall of a passage through which a cooling fluid can flow. Since the circuit board—such as for example a DBT board—is electrically insulating through the ceramic plate, no additional insulation of the electrical components from the cooling fluid is necessary and the circuit board as well as the electrical components can be cooled directly.

However, with the already known concepts, local temperature elevations—so-called hotspots—can develop on the circuit board. These correspond to the individual electrical components being heated. The local temperature elevations are decisive for the efficient operation of the power electronics and determine the current working temperature of the power electronics unit. Disadvantageously, the electrical components subjected to less heating and because of this the power electronics unit as a whole cannot be optimally operated because of this.

SUMMARY

The object of the invention therefore is to state an improved or at least alternative embodiment for a power electronics unit of the generic type, with which the described disadvantages are overcome.

According to the invention, this object is solved through the subject matter of the independent claim(s). Advantageous embodiments are the subject matter of the dependent claim(s).

The present invention is based on the general idea of specifically levelling local temperature elevations—so-called hotspots—developing in a power electronics unit in order to be thus able to more effectively operate the power electronics unit. A power electronics unit comprises at least one circuit board and one cooling device. The at least one circuit board comprises at least one electronic component which in a heat transfer region lies flat against an electronics side of the at least one circuit board in a heat-transferring manner. Here, the cooling device comprises at least one impingement jet chamber which can be flowed through by a cooling fluid from an inlet to an outlet. Furthermore, the impingement jet chamber is heat-transferringly connected, on a cooling side located opposite the electronics side, to the at least one circuit board, so that the power dissipation generated in the at least one electronic component could be passed on in the heat transfer region to the cooling fluid in the impingement jet chamber. According to the invention, the cooling device comprises at least one nozzle plate having at least one flow nozzle. The nozzle plate is arranged in the impingement jet chamber and divides the same into at least one inlet-side inlet chamber and into at least one outlet-side outlet chamber. The at least one inlet chamber and the at least one outlet chamber are fluidically connected to one another via the at least one flow nozzle. Furthermore, the at least one flow nozzle is arranged spaced apart from the heat transfer region of the at least one electronic component, so that the at least one flow nozzle accelerates and conducts the cooling fluid flowing in through the inlet towards the heat transfer region of the electronic component. The impingement jet chamber can be delimited towards the outside by the circuit board at least on one side.

In the power electronics unit according to the invention, the cooling fluid flows out of the inlet into the inlet chamber and is conducted via the at least one flow nozzle into the outlet chamber. In this way, the nozzle plate constitutes a so-called plenary tube. Here, the at least one flow nozzle is arranged spaced apart from the heat transfer region of the at least one electronic component, so that the cooling fluid flowing out of the flow nozzle is accelerated and conducted towards the heat transfer region. In the process, the cooling fluid impinging on the cooling side of the circuit board in the heat transfer region with a high velocity in the form of an impingement jet, as a result of which the heat transfer coefficient on the heat transfer region is increased. Here, high velocity means that the velocity of the cooling fluid flowing out of the flow nozzle prior to impinging on the circuit board is substantially higher than the velocity of the cooling fluid after impinging on the circuit board and before leaving the outlet chamber. A heat flow between the cooling fluid and the circuit board corresponding to the heat transfer coefficient can thereby by specifically increased in the heat transfer region. Since the power dissipation generated in the at least one electronic component is passed on to the cooling fluid in the heat transfer region, the electronic component can thereby cooled specifically and because of this the local temperature increases in the circuit board levelled specifically. In this advantageous manner, the current working temperature of the at least one electronic component can be reduced and because of this the power electronics unit as a whole be operated more efficiently. When the impingement jet chamber is delimited by the circuit board on one side, the cooling fluid can directly circulate about the circuit board and the latter be cooled directly because of this. When the circuit board is a DBC board, the respective power electronics unit can be electrically insulated from the cooling fluid by a ceramic board. In particular, no additional insulation of the respective power electronics unit from the cooling fluid is thus necessary and the circuit board and the respective power electronics unit can be efficiently cooled.

Advantageously it can be provided that the at least one flow nozzle is formed in the nozzle plate by a nozzle orifice and a nozzle wall surrounding the nozzle orifice and projecting from the nozzle plate directed into the outlet chamber. The nozzle orifice has a flow cross section which determines the velocity of the cooling fluid when flowing through the nozzle orifice. Here, the flow cross section can be adjusted in such a manner that the cooling fluid impinging on the circuit board in the heat transfer region with a high velocity. In the process, the cooling fluid can be conducted to the heat transfer region by the nozzle wall.

Advantageously it can be provided that the at least one nozzle plate is arranged in the impingement jet chamber parallel to and spaced apart from the at least one circuit board and the at least one flow nozzle is directed to the heat transfer region at a jet angle. Here, the jet angle can be between 30° and 150°, but is preferably between 80° and 100°. The jet angle can be defined as an angle between a jet axis of the cooling fluid and the nozzle plate. Consequently the jet angle is an indication of the angle at which the cooling fluid leaves the flow nozzle relative to the nozzle plate. If the nozzle plate comprises multiple flow nozzles arranged next to one another, these can be directed into the same heat transfer region through different jet angles and the at least one electronic component in this heat transfer region be cooled particularly intensively.

In a further development of the power electronics unit according to the invention it is provided that a flow cross section of the at least one inlet chamber decreases away from the inlet and a flow cross section of the at least one outlet chamber increases towards the outlet. In this advantageous manner, the velocity of the cooling fluid in the inlet chamber can be kept constant, as a result of which in the case of multiple flow nozzles arranged next to one another the cooling fluid through all flow nozzles flow out with a same velocity and independently of the arrangement of the flow nozzle relative to the inlet causes an identical cooling effect of the circuit board by the respective flow nozzle. In order to keep the velocity of the cooling fluid constant also in the outlet chamber, the flow cross section of the outlet chamber becomes correspondingly larger towards the outlet. Here, the respective flow cross section is to be determined transversely to the main flow direction of the cooling fluid in the outlet chamber or in the inlet chamber. Alternatively it can be provided that a flow cross section of the at least one inlet chamber and a flow cross section of the at least one outlet chamber are constant.

Advantageously it can be provided that the at least one inlet chamber is formed by at least one inflow passage, which fluidically connects the inlet and the at least one flow nozzle with one another. The at least one inflow passage can be delimited on the one side by the at least one nozzle plate and on the other side by a cover plate lying against the nozzle plate in a fixed manner. In this way, the cooling fluid can be specifically conducted to the at least one flow nozzle and the construction of the cooling device can be additionally simplified. Advantageously, the at least one outlet chamber can be fluidically connected to the outlet via at least one draining passage, which is delimited on the one side by the nozzle plate and on the other side by the cover plate. The at least one draining passage can be fluidically connected to the outlet chamber via an outlet opening formed in the nozzle plate, which outlet opening fluidically connects the at least one draining passage with the outlet chamber through the nozzle plate. Advantageously, the at least one inflow passage can be formed in the nozzle plate and/or in the cover plate. Alternatively or additionally, the at least one draining passage can be formed in the nozzle plate and/or in the cover plate. The at least one inflow passage and the at least one draining passage can be alternatively or additionally arranged parallel to one another.

Additionally it can be advantageously provided that in the at least one nozzle plate at least two flow nozzles are formed adjacent to one another and the at least one outlet opening is arranged between the adjacent flow nozzles. Because of this, the cooling fluid can flow through the flow nozzles into the outlet chamber and in the region between the adjacent flow nozzles, flow out of the outlet chamber through the outlet opening. When the cooling fluid impinges on the circuit board in the heat transfer region, eddy regions develop in the outlet chamber laterally on the respective flow nozzles. At the adjacent flow nozzles, these eddy regions coincide in the region between the adjacent flow nozzles. Through the outlet opening arranged in this region, the cooling fluid flows out of the outlet chamber so that the pressure loss during the return flow of the cooling fluid out of the outlet chamber is minimised. Because of this, the efficiency of the cooling device can be increased and the power electronics unit operated more efficiently.

Advantageously it can be provided that the at least one outlet chamber is fluidically connected to the outlet via at least one lateral draining passage. The at least one lateral draining passage can be delimited towards the outside laterally on the at least one circuit board and the at least one nozzle plate by at least one side plate. With this advantageous configuration, the outlet chamber and the inlet chamber can be thermally decoupled from one another. Furthermore, the height of the cooling device defined perpendicularly to the cooling surface and because of this the installation space requirement for the power electronics unit can be reduced. In addition it can be provided that the inlet chamber is connected to the inlet via at least one inlet opening formed in the side plate. Here, the inlet opening can connect the inlet chamber through the side plate with the inlet.

In a further development of the power electronics unit it can be provided that the power electronics unit comprises two circuit boards facing one another with the cooling side, between which the impingement jet chamber is arranged. In addition, the power electronics unit can comprise two nozzle plates arranged on one another, which towards one another delimit the at least one inlet chamber and towards the circuit boards the outlet chamber at least in regions. With this advantageous configuration of the power electronics unit, two circuit boards can be cooled by the cooling device, as a result of which the cooling efficiency in the power electronics unit can be increased. Furthermore, the installation space necessary for the power electronics unit and the own weight of the power electronics unit can thereby be reduced. With this configuration of the power electronics unit, the at least one outlet chamber can be fluidically connected to the outlet via at least one lateral draining passage. Here, the at least one lateral draining passage can be delimited towards the outside laterally on the circuit boards and the nozzle plates by at least one side plate. In addition, the inlet chamber can be connected to the inlet via at least one inlet opening formed in the side plate. Here, the inlet opening can connect the inlet chamber with the inlet through the side plate.

Advantageously it can be provided that the at least one nozzle plate comprises multiple flow nozzles which are arranged next to one another and form at least one flow region on the nozzle plate. The at least one flow region of the at least one nozzle plate can be arranged located opposite and spaced apart from the at least one heat transfer region of the at least one circuit board. The flow nozzles arranged in the flow region are practically directed towards the heat transfer region so that the electronic component in the heat transfer region is particularly efficiently and intensively cooled by the multiple flow nozzles. It is conceivable that the nozzle plate comprises multiple such flow regions which are arranged distributed on the nozzle plate. The respective flow regions can be assigned, individually or in groups, to multiple heat transfer regions on the cooling side of the circuit board. Alternatively or additionally, the multiple heat transfer regions can also be assigned, individually or in groups, to the respective flow regions. The individual flow regions can differ from one another by the number, the arrangement, the distance from one another or the orientation of the flow nozzles. Basically, the configuration of the respective flow region can be matched to the electronic component in the corresponding heat transfer region. For example, the flow region, for cooling an electronic component being intensively heated—such as for example a semiconductor or a diode—can comprise more flow nozzles than the flow region for cooling an electric component being slightly heated. In this advantageous manner, the temperature differences—so-called hotspots—can be levelled on the circuit board and because of this the power electronics unit operated efficiently.

In summary, the electronic components subjected to slight heating and the electronic components subjected to intense heating can be subjected to different intensities of cooling in the power electronics unit. By way of this, the temperature differences of the circuit board can be levelled as a result of which the power electronics unit can be operated efficiently.

Further important features and advantages of the invention subclaims, from the drawing and from the associated figure description by way of the drawings.

It is to be understood that the features mentioned above and still to be explained in the following cannot only be used in the respective combination stated but also in other combinations or by themselves without leaving the scope of the present invention.

Preferred exemplary embodiments of the invention are shown in the drawing and are explained in more detail in the following description, wherein same reference numbers relate to same or similar or functionally same components.

BRIEF DESCRIPTION OF THE DRAWINGS

It shows, in each case schematically

DETAILED DESCRIPTION

Figure 1:
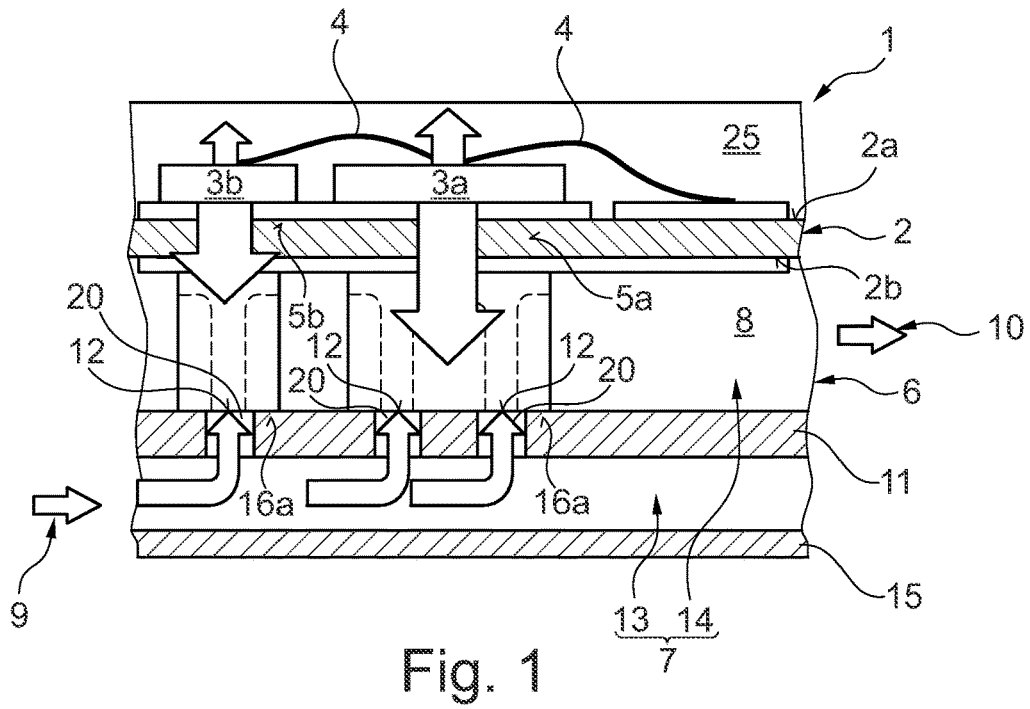
FIG. 1 shows a fundamental construction of a power electronics unit according to the invention in a sectional view.

FIG. 1 shows a fundamental construction of a power electronics unit 1 according to the invention in a sectional view. The power electronics unit 1 comprises a circuit board 2—here a DBC board—having an electronics side 2a and a cooling side 2b. On the electronics side 2a, two electronic components 3a and 3b—for example IGBT, MOSFET, diode, semiconductor or others—are fixed which are electrically interconnected via conductor wires 4 and covered with a protective layer 25. The respective electronic component 3a and 3b lies heat-transferringly against the circuit board 2 in a heat transfer region 5a and 5b. For cooling the electronic components 3a and 3b, the power electronics unit 1 comprises a cooling device 6. Here, the cooling device 6 comprises an impingement jet chamber 7, which can be flowed through by a cooling fluid 8 from an inlet 9 to an outlet 10. The impingement jet chamber 7 is heat-transferringly connected to the cooling side 2b of the circuit board 2, wherein the circuit board 2 unilaterally delimits the impingement jet chamber 7 towards the outside. The power dissipation generated in the respective electronic component 3a or 3b is passed on in the respective heat transfer region 5a or 5b to the cooling fluid 8 in the impingement jet chamber 7 and by way of this the respective electronic component 3a or 3b directly cooled.

For the specific cooling of the electronic components 3a and 3b, the cooling device 6 comprises a nozzle plate 11 with multiple flow nozzles 12. Here, the respective flow nozzle 12 is formed by a nozzle orifice 20 in the nozzle plate 11. The nozzle plate 11 divides the impingement jet chamber 7 into an inlet-side inlet chamber 13 and into an outlet-side outlet chamber 14, so that the inlet chamber 13 and the outlet chamber 14 are exclusively fluidically connected to one another by the flow nozzles 12. Here, the nozzle plate 11 is arranged parallel to and spaced apart from the circuit board 2, so that the inlet chamber 13 is delimited towards the outside by the nozzle plate 11 and a cover plate 15 and the outlet chamber 14 by the circuit board 2 and the nozzle plate 11 in regions. In FIG. 1, only an extract of the power electronics unit 1 is shown in section. It is obvious that the inlet chamber 13 and the outlet chamber 14 are also laterally closed and, towards the outside, are exclusively fluidically connected via the inlet 9 and the outlet 10.

In the power electronics unit 1, the cooling fluid 8 flows out of the inlet 9 into the inlet chamber 13 and is conducted via the flow nozzles 12 into the outlet chamber 14 as indicated by arrows. While flowing through the flow nozzles 12 to the heat transfer region 5a or 5b of the respective electronic component 3a or 3b the cooling fluid 8 is accelerated. In the process, the cooling fluid 8 impinging on the cooling side 2b of the circuit board 2 in the respective heat transfer region 5a or 5b with a high velocity in the form of an impingement jet and the heat transfer coefficient on the heat transfer region 5a or 5b is increased by way of this. By way of this, a heat flow corresponding to the heat transfer coefficient between the cooling fluid 8 and the circuit board 2 can be specifically increased in the respective heat transfer region 5a or 5b. Since the power dissipation generated in the respective electronic component 3a and 3b is transferred in the heat transfer region 5a and 5b to the cooling fluid 8, the electronic component 3a and 3b can thereby be specifically cooled.

The flow nozzles 12 are arranged next to one another and form two flow regions 16a and 16b on the nozzle plate 11. The respective flow region 16a and 16b is arranged located opposite the respective heat transfer region 5a and 5b so that the cooling fluid 8 flowing out of the flow nozzles 12 in the respective flow region 16a or 16b specifically cools the electronic 3a or 3b in the respective heat transfer region 5a or 5b. The flow regions 16a and 16b differ from one another by the number of the flow nozzles 12 per unit of area and thus by the performance density. In this exemplary embodiment, the flow region 16a comprises multiple flow nozzles 12 per unit of area and accordingly a higher performance density. As indicated by arrows, the electronic component 3a is heated more intensively than the electronic component 3b and is also more intensively cooled by the flow region 16a than the electronic component 3b. Thus, the performance density of the flow regions 16a and 16b in this exemplary embodiment is matched to the heat flow density of the electronic components 3a and 3b in the respective heat transfer regions 5a and 5b. In this way, the local temperature elevations on the circuit board 2 are specifically levelled in the power electronics unit 1. The current working temperature of the respective electronic components 3a and 3b is thereby reduced and the power electronics unit 1 as a whole can be operated more efficiently.

Figure 2:
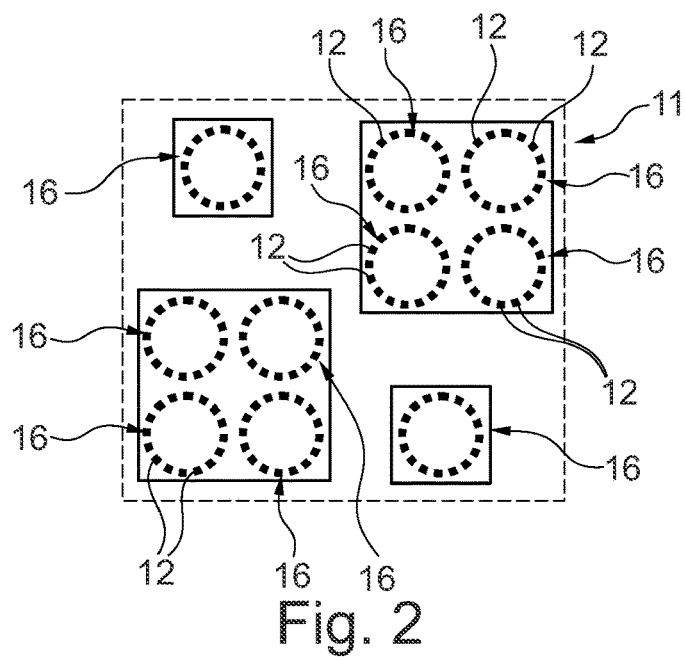
FIG. 2 shows a possible configuration of a nozzle plate in a cooling device of a power electronics unit according to the invention in a plan view.

FIG. 2 shows an exemplary configuration of the nozzle plate 11 for cooling a half bridge with a diode and an IGBT. Here, the nozzle plate 11 comprises altogether ten identical flow regions 16 which are arranged in four groups. The respective flow region 16 comprises multiple flow nozzles 12 which are provided for cooling the individual electronic component 3.

Figure 3:
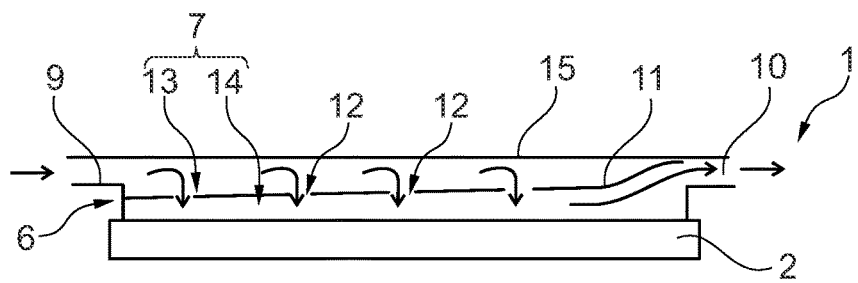
FIG. 3 shows a possible further development of a power electronics unit according to the invention in a sectional view.

FIG. 3 shows a possible further development of the impingement jet chamber 7 in a sectional view. In this exemplary embodiment, a flow cross section of the inlet chamber 13 decreases away from the inlet 9 and a flow cross section of the outlet chamber 14 increases towards the outlet 10. By way of this, the volume flow of the cooling fluid 8 through the respective, in this exemplary embodiment identical, flow nozzles 12 remains constant and the cooling fluid 8 flows out of all flow nozzles 12 with a same velocity. Thus, regardless of the arrangement of the flow nozzle 12 at the inlet 9, an identical cooling effect can be achieved on the circuit board 2. Altogether, the power electronics unit 1 can be cooled efficiently through such a configuration of the inlet chamber 13 and of the outlet chamber 14.

Figure 4:
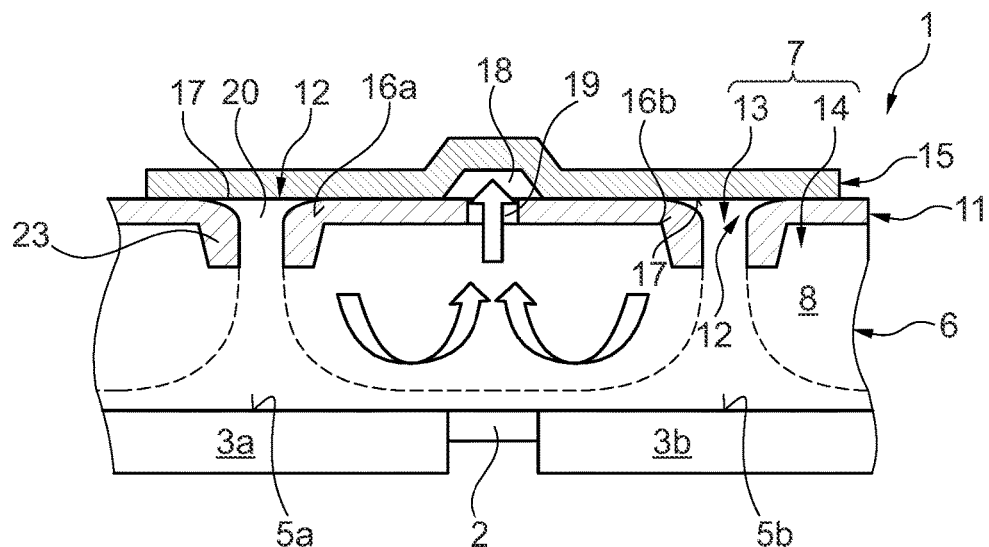
FIG. 4 shows a sectional view of a power electronics unit according to the invention in a first embodiment.

FIG. 4 shows a sectional view of the power electronics unit 1 in a first embodiment. Here, the inlet chamber 13 is formed by inflow passages 17 which fluidically connect the inlet 9—not visible here—and the flow nozzles 12 with one another. Here, the inflow passages 17 are formed in the nozzle plate 11 and are delimited on the one side by the nozzle plate 11 and on the other side by the cover plate 15. The outlet chamber 14 is fluidically connected to the outlet 10—not visible here—via an draining passage 18, which is formed in the cover plate 15. The draining passage 18 is delimited on the one side by the nozzle plate 11 and on the other side by the cover plate 15 and fluidically connected through the nozzle plate 11 to the outlet chamber 14 by way of an outlet opening 19 formed in the nozzle plate 11. The inflow passages 17 and the draining passage 18 are arranged parallel to one another and run perpendicularly to the drawing plane.

The two flow nozzles 12 are provided for cooling the electronic components 3a and 3b on the circuit board 2 and are arranged next to one another in the nozzle plate 11. The outlet opening 19 is arranged between the flow nozzles 12 so that following the impingement of the cooling fluid 8 on the heat transfer regions 5a and 5b of the circuit board 2, eddy flows developing laterally on the respective flow nozzles 12 between the flow nozzles 12 converge. Advantageously, the outlet opening 9 is arranged in the region of the converging eddy flows so that the cooling fluid 8 flows directly into the draining passage 18 and further on to the outlet 10—not visible here. By way of this, the pressure loss in the outlet chamber 14 can be minimised and the efficiency of the cooling device increased. The flow of the cooling fluid 8 in the outlet chamber 14 is indicated by arrows.

In this embodiment of the power electronics unit 1 the respective flow regions 16a and 16b are formed by a flow nozzle 12 each. Here, the respective flow nozzle 12 is formed by the nozzle orifice 20 and a nozzle wall 23 which surrounds the nozzle orifice 20 and projects from the nozzle plate 11 into the outlet chamber 14. The velocity of the cooling fluid 8 while flowing through the nozzle orifice 20 or the flow nozzle 12 can be adjusted by way of a flow cross section. In this exemplary embodiment, the flow nozzles 12 are orientated at a jet angle equal to 90° to the cooling side 2b of the circuit board 2, so that the cooling fluid 8 is conducted via the shortest path to the heat transfer regions 5a and 5b and impinges on the circuit board 2 at the jet angle equal to 90°.

Figure 5:
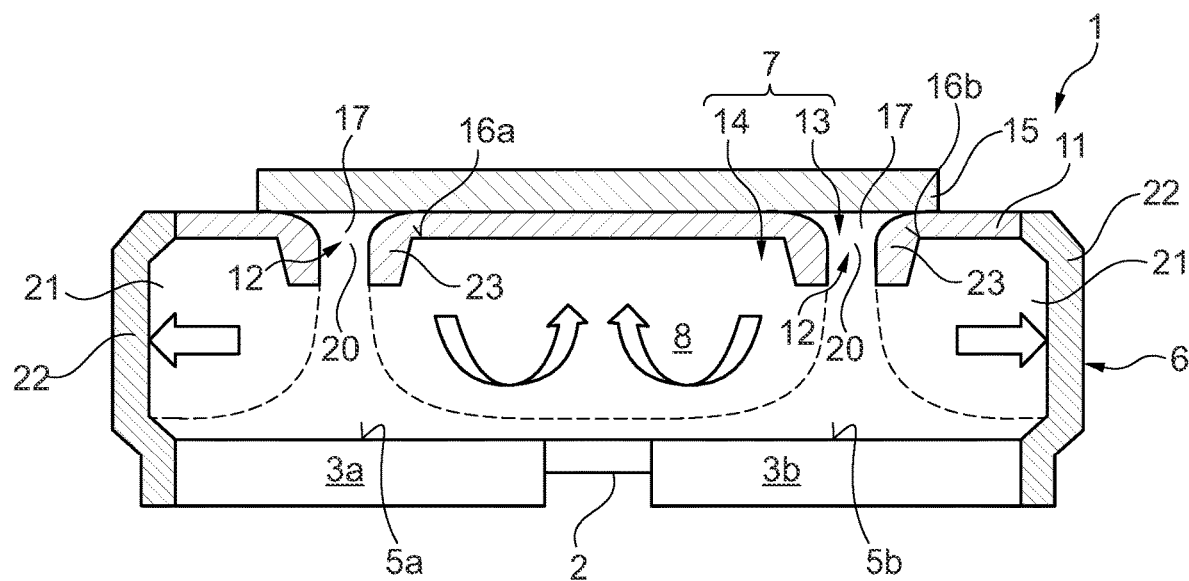
FIG. 5 shows a sectional view of a power electronics unit according to the invention in a second embodiment.

FIG. 5 shows a sectional view of the power electronics unit 1 in a second embodiment. Here, the inlet chamber 13—identical to the first embodiment—is formed by the inflow passages 17 which on the one side are delimited towards the outside by the nozzle plate 11 and on the other side by the cover plate 15. For draining the cooling fluid 8 out of the outlet chamber 14, side draining passages 21 are provided in this embodiment of the power electronics unit 1, which are arranged laterally on the circuit board 2 and on the nozzle plate 11 and are each delimited towards the outside by a side plate 22. Otherwise the construction of the power electronics unit 1 shown here corresponds to the power electronics unit 1 in the first embodiment. The flow of the cooling fluid 8 in the outlet chamber 14 is indicated by arrows.

Figure 6:
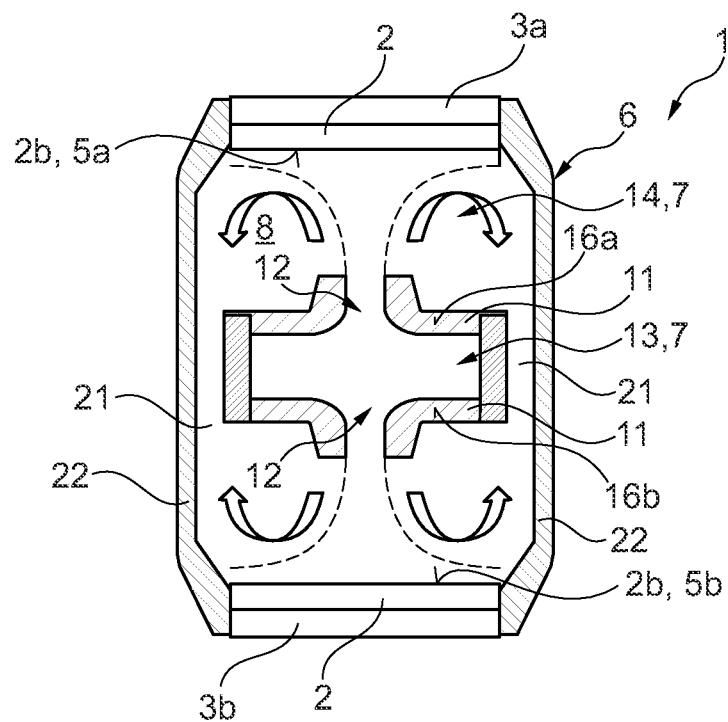
FIGS. 6 and 7 show sectional views of a power electronics unit according to the invention in a third embodiment.
Figure 7:
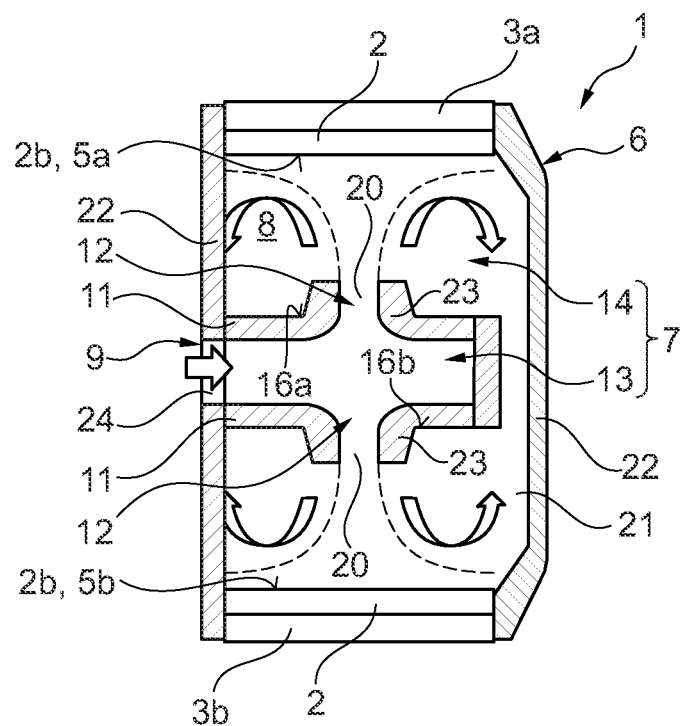

FIGS. 6 and 7 show sectional views of the power electronics unit 1 in a third embodiment. The power electronics unit 1 comprises two circuit boards 2 which with the respective cooling side 2b are arranged facing one another. Between the circuit boards 2 the impingement jet chamber 7 is arranged. Furthermore, the power electronics unit 1 comprises two nozzle plates 11 arranged on one another, which towards one another, delimit the inlet chamber 13 and towards the circuit boards 2, the outlet chamber 14. Laterally, the outlet chamber 14 is delimited by the side plate 22, which additionally delimit the side draining passages 21. The inlet chamber 13 is connected to the inlet 9 through the respective side plate 22 via an inlet opening 24 formed in one of the side plates 22. Otherwise the construction of the power electronics unit 1 shown here corresponds to the power electronics unit 1 in the second embodiment. The flow of the cooling fluid 8 in the impingement jet chamber 7 is indicated by arrows.

In summary, the slightly heated electronic components 3b and the intensively heated electronic components 3a in the power electronics unit 1 can be cooled with different intensities. By way of this, the temperature differences on the circuit board 2 can be levelled as a result of which the power electronics unit 1 can be operated efficiently.

The invention claimed is:

1. A power electronics unit, comprising:
at least one circuit board including at least one electronic component which, in a heat transfer region, is disposed flat against an electronics side of the at least one circuit board in a heat-transferring manner;
a cooling device including at least one impingement jet chamber through which a cooling fluid is flowable from an inlet to an outlet;
the at least one impingement jet chamber heat-transferringly connected to the at least one circuit board on a cooling side disposed opposite the electronics side such that a power dissipation provided by the at least one electronic component is transferable, in the heat transfer region, to the cooling fluid in the at least one impingement jet chamber;
the cooling device further including at least one nozzle plate having at least one flow nozzle, the at least one nozzle plate arranged in and dividing the at least one impingement jet chamber into at least one inlet-side inlet chamber and at least one outlet-side outlet chamber, the at least one inlet chamber and the at least one outlet chamber fluidically connected to one another via the at least one flow nozzle;
wherein the at least one flow nozzle is arranged spaced apart from the heat transfer region of the at least one electronic component such that the at least one flow nozzle accelerates and conducts the cooling fluid flowing in through the inlet towards the heat transfer region of the at least one electronic component;
wherein the at least one outlet chamber is fluidically connected to the outlet via at least one draining passage, which on one side is delimited by at least one cover plate disposed against and coupled to the at least one nozzle plate and on the other side by the at least one nozzle plate; and
wherein the at least one draining passage is fluidically connected to the at least one outlet chamber via an outlet opening disposed in the at least one nozzle plate, which through the at least one nozzle plate fluidically connects the at least one draining passage with the at least one outlet chamber.

2. The power electronics unit according to claim 1, wherein at least one side of the at least one impingement jet chamber is delimited towards an outside by the at least one circuit board.

3. The power electronics unit according to claim 1, wherein:
the at least one flow nozzle is defined by a nozzle orifice and a nozzle wall surrounding the nozzle orifice; and
the nozzle wall projects from the at least one nozzle plate into the at least one outlet chamber such that the cooling fluid flowing in through the inlet is conducted towards the heat transfer region of the at least one electronic component.

4. The power electronics unit according to claim 1, wherein:
the at least one nozzle plate is arranged in the at least one impingement jet chamber parallel to and spaced apart from the at least one circuit board; and
the at least one flow nozzle is directed at the heat transfer region at a jet angle of 30° to 150°.

5. The power electronics unit according to claim 4, wherein the jet angle is 80° to 100°.

6. The power electronics unit according to claim 1, wherein the at least one inlet chamber has a first flow cross section and the at least one outlet chamber has a second flow cross section, and wherein at least one of:
the first flow cross section of the at least one inlet chamber decreases in a direction away from the inlet and the second flow cross section of the at least one outlet chamber increases in a direction towards the outlet; and
the first flow cross section of the at least one inlet chamber and the second flow cross section of the at least one outlet chamber are constant.

7. The power electronics unit according to claim 1, wherein:
the at least one inlet chamber is defined by an inflow passage which fluidically connects the inlet and the at least one flow nozzle with one another; and
the at least one inflow passage is delimited on one side by the at least one nozzle plate and on the other side by at least one cover plate disposed against and coupled to the at least one nozzle plate.

8. The power electronics unit according to claim 7, wherein the at least one inflow passage is formed in at least one of the at least one nozzle plate and the at least one cover plate.

9. The power electronics unit according to claim 7, wherein the at least one inflow passage and the at least one draining passage are arranged parallel to one another.

10. The power electronics unit according to claim 1, wherein:
the at least one flow nozzle includes at least two flow nozzles disposed adjacent to one another; and
the outlet opening is arranged between the at least two flow nozzles such that the cooling fluid is flowable through the at least two flow nozzles into the at least one outlet chamber and, in a region between the at least two flow nozzles, is flowable out of the at least one outlet chamber through the outlet opening.

11. The power electronics unit according to claim 1, wherein the at least one inlet chamber is connected to the inlet via at least one inlet opening disposed in at least one side plate, which through the at least one side plate connects the at least one inlet chamber with the inlet.

12. The power electronics unit according to claim 1, wherein:
the at least one flow nozzle includes a plurality of flow nozzles arranged next to one another and which form at least one flow region on the at least one nozzle plate; and
the at least one flow region of the at least one nozzle plate is disposed opposite and spaced apart from the heat transfer region.

13. The power electronics unit according to claim 1, wherein the at least one draining passage is formed in at least one of the at least one nozzle plate and the at least one cover plate.

14. A power electronics unit, comprising: at least one circuit board having an electronics side and a cooling side disposed opposite one another; at least one electronic component disposed, in a heat transfer region, flat against the electronics side of the at least one circuit board in a heat-transferring manner; a cooling device including at least one impingement jet chamber through which a cooling fluid is flowable from an inlet to an outlet; the at least one impingement jet chamber heat-transferringly connected to the cooling side of the at least one circuit board such that a power dissipation provided by the at least one electronic component is transferable in the heat transfer region to the cooling fluid in the at least one impingement jet chamber; the cooling device further including at least one nozzle plate having at least one flow nozzle, the at least one nozzle plate arranged in and dividing the at least one impingement jet chamber into at least one inlet-side inlet chamber and at least one outlet-side outlet chamber, the at least one inlet chamber and the at least one outlet chamber fluidically connected to one another via the at least one flow nozzle; wherein the at least one nozzle plate is arranged in the at least one impingement jet chamber parallel to and spaced apart from the at least one circuit board; and wherein the at least one flow nozzle is arranged spaced apart from the heat transfer region of the at least one electronic component such that the at least one flow nozzle accelerates and conducts the cooling fluid flowing in through the inlet towards the heat transfer region of the at least one electronic component wherein the at least one outlet chamber is fluidically connected to the outlet via at least one draining passage, which on one side is delimited by at least one cover plate disposed against and coupled to the at least one nozzle plate and on the other side by the at least one nozzle plate; and wherein the at least one draining passage is fluidically connected to the at least one outlet chamber via an outlet opening disposed in the at least one nozzle plate, which through the at least one nozzle plate fluidically connects the at least one draining passage with the at least one outlet chamber.

15. The power electronics unit according to claim 14, wherein a flow cross section of the at least one inlet chamber and a flow cross section of the at least one outlet chamber are constant.

16. The power electronics unit according to claim 14, wherein the at least one flow nozzle includes a plurality of flow nozzles that are directed toward the heat transfer region at different jet angles.

17. The power electronics unit according to claim 14, wherein:
   the at least one electronic component includes a plurality of electronic components; and
   the at least one flow nozzle includes a plurality of flow nozzles that are directed at different jet angles toward an individual electronic component of the plurality of electronic components.

18. The power electronics unit according to claim 14, wherein:
   the at least one electronic component includes a plurality of electronic components;
   the at least one flow nozzle includes a plurality of flow nozzles arranged in groups to define a plurality of flow regions;
   each of the plurality of flow regions is structured and arranged to accelerate and conduct the cooling fluid toward the heat transfer region of an associated subset of the plurality of electronic components; and
   the plurality of flow regions each have a performance density that is matched to a heat flow density of the associated subset of the plurality of electronic components.

19. The power electronics unit according to claim 18, wherein the performance density is defined as a number of the plurality of flow nozzles per unit of area.

* * * * *